Figure 1:
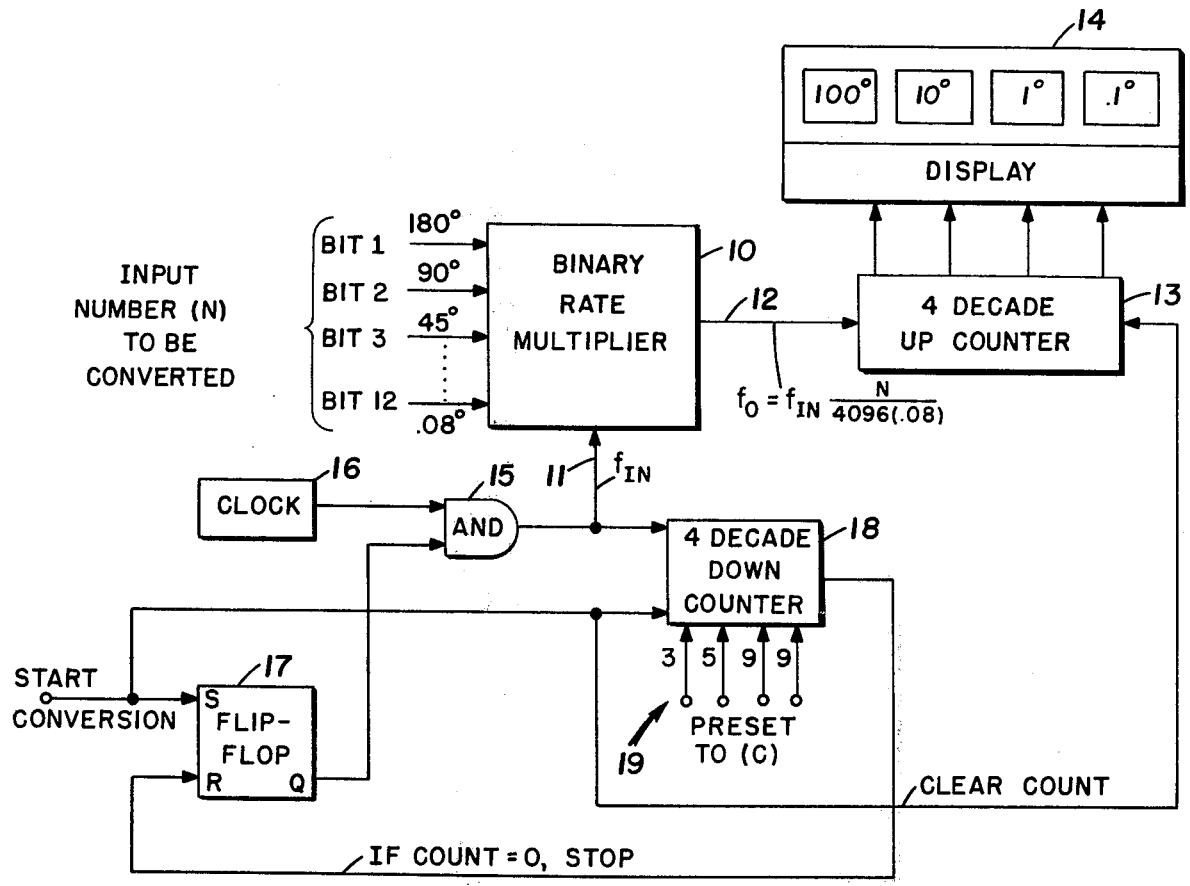

United States Patent [19]

Sharp et al.

[11] 4,011,559
[45] Mar. 8, 1977

[54] UNIVERSAL BINARY CODE CONVERTER

[75] Inventors: Donald L. Sharp, S. Burlington, Vt.;
Eugene A. Frekko, Rockville, Md.

[73] Assignee: The United States of America as represented by the Secretary of the Navy, Washington, D.C.

[22] Filed: July 21, 1975

[21] Appl. No.: 597,842

[52] U.S. Cl. .......................... 340/347 DD; 235/155
[51] Int. Cl.² ..................................... H03K 13/24
[58] Field of Search ............ 235/155; 340/347 DD

[56] References Cited
UNITED STATES PATENTS

| | | | |
|---|---|---|---|
| 2,401,621 | 6/1946 | Desch | 235/155 |
| 2,831,179 | 4/1958 | Wright | 235/155 |
| 2,845,219 | 7/1958 | Piel | 235/155 |
| 2,865,563 | 12/1958 | Wright | 235/155 |
| 2,989,235 | 6/1961 | Dickinson | 235/155 |
| 3,039,689 | 6/1962 | Wright | 235/155 |
| 3,748,450 | 7/1973 | Fico | 340/347 DD |

*Primary Examiner*—Charles D. Miller

[57] ABSTRACT

The invention relates to a method and apparatus for performing binary code conversion and, in particular, for converting binary input to binary coded decimal (BCD) form. An $n$-bit decade down counter is preset to establish a basic timing interval during which timing or clock pulses are applied to a binary rate multiplier and a number of output count pulses are generated by the rate multiplier in direct proportion to the value of the binary input number to be converted. An $n$-bit decade up counter registers a count of the output pulses from the rate multiplier. Since the maximum number of pulses in the basic timing interval, each of which has a weight equal to the least significant bit of the converted binary coded decimal signal, is equal to the maximum value (within one least significant bit) of the binary input number to be converted, the number of count pulses generated by the rate multiplier and registered by the up counter during the timing interval represents the magnitude of the input number itself.

8 Claims, 1 Drawing Figure

UNIVERSAL BINARY CODE CONVERTER

BACKGROUND OF THE INVENTION

There are many instances where binary type information needs to be converted to and from another code format such as binary coded decimal (BCD) form. For example, digital computers are normally designed to process input numerical data utilizing binary arithmetic; whereas, persons who must interface with the computer understand and utilize decimal numbers. Similarly, a binary to BCD conversion has utility in providing visual read-out, in decimal format, of information originally in binary form, such as for example, the display of radar antenna position which is first attained by converting from five-wire synchro to binary angle measure (BAM) code. Techniques for converting from binary to BCD form have been proposed previously but, so far as is known, they generally have been inapplicable where the weight of the least significant bit of the binary input number is not unity or related to unity by a power of ten; e.g., 1.0, 0.1, 0.01, etc.

SUMMARY OF THE INVENTION

In accordance with the present invention, a down counter is preset to the maximum converted value of the binary input number to be converted. The binary number is applied as control input directly to a binary rate multiplier. At the start of the conversion process, a clock signal is applied simultaneously to the rate multiplier and to the down counter. Since the down counter stops the conversion process when it reaches a zero count condition, the maximum number of clock or timing pulses into the rate multiplier will be the preset value of the down counter, whereas the number of pulses output by the rate multiplier during the conversion period or interval will be directly proportional to value of the input binary number, so that these pulses from the rate multiplier need merely be counted, e.g., in an up counter, during the conversion interval to provide the desired converted output. As will be obvious to one skilled in the art, the method and apparatus of the present invention is applicable to many different input/output code conversion processes by simply changing the base (output code) of the up and down counters and the preset value of the down counter (input code). The rate of conversion is also flexible, being a function of the conversion clock rate and the preset value of the down counter.

In view of the foregoing, one object of the present invention is to provide an improved binary code converter.

A further object of the present invention is to provide converter circuitry particularly suited for converting binary angular measure (BAM) code, such as that representing search radar antenna position, into a binary coded decimal form, wherein a binary rate multiplier responds to the input BAM code and to timing or clock pulses which are applied for a controlled conversion interval preset to correspond to the maximum value of the input data, the rate multiplier producing during such interval output pulses whose count is directly proportional to the existing or actual value of the input binary number and represents the converted BCD form of the binary input.

Other objects, purposes and characteristic features of the present invention will in part be pointed out as the description of the invention progresses and in part be obvious from the accompanying single drawing which illustrates, in block diagram, one embodiment of the present invention for performing conversion of input binary angular measure (BAM) code to binary coded decimal (BCD) form, for readout.

As is well-known to those skilled in the art, digital circuitry exists for converting positional information output of rotating devices, such as radar antenna, to a binary value. Such circuitry may for example use a 12-bit binary angular measure code, commonly referred to as BAM, whose bit weights extend from 180° for the most significant bit ($2^{11}$) to 0.088° for the least significant bit ($2^0$), with the intervening bits $2^{10}$ through $2^1$ having bit weights each one-half the angular value of the preceding bit; e.g., bit $2^{10}$ has a weight of 90°, etc. In order to present the value of the angular position information in a display directly readable in degrees, it is necessary to convert the BAM code to a code which is compatible with standard decade display units, such as those which utilize light emitting diodes. The illustrated embodiment of the present invention is designed to perform continuous sampling and conversion of a 12-bit BAM code into four decades of binary coded decimal readout.

More particularly, the 12-bit BAM code to be converted is applied directly to the digital inputs of a conventional binary rate multiplier 10 which also receives, at input line 11, clock or timing pulses to be described hereinafter. The rate multiplier 10 operates in a well-known fashion to produce, on output line 12, a number of pulses whose count, during the interval which the timing pulses are applied on input line 11, is directly proportional to the value of the binary angular measure (BAM) number to be converted; that is, during the period of application of the timing pulses on line 11, the rate multiplier's output frequency may be expressed as $$f_{out} = f_{in} \times (N/N_{max}) \qquad \text{Eq. 1.}$$

where $N$ = decimal equivalent of the number to be converted and $N_{max}$ = decimal equivalent of maximum value of the number to be converted. Therefore, the number of pulses out of the rate multiplier during the interval may be expressed as $$P = C \times (N/N_{max}) \qquad \text{Eq. 2.}$$

where $C$ = the number to which a down counter is preset, selected in accordance with the number of resolution cells into which the maximum value of the number to be converted is subdivided. By way of example, in one practical application of the present invention, the binary rate multiplier unit 10 is formed by interconnecting, in well-known configuration, two 6-bit Texas Instrument Co. integrated circuits, type SN 7497.

The output count pulses from the binary rate multiplier 10 are applied to and counted by a four decade up counter 13, also of conventional design, which registers in its four stages a total count of said output count pulses. Readout of the registered count in counter 13 is provided by display unit 14 which may, for example, be formed of four light emitting diodes (LED) numeric display segments. In the practical application mentioned above, Hewlett-Packard units HP5082-73 were employed. Obviously, however, the registered count output of the counter 13 could, if desired, be used as input to a digital computer or any other appropriate utilization means.

A logical AND gate 15 has one input connected to a source of clock pulses 16 and its other input connected to the Q output of flip-flop circuit 17. In the practical application noted, the clock source 16 produced a 3.6 MHz output pulse rate. It should be noted here that other clocking frequencies can be employed and, in fact, a 10 MHz source has also been successfully employed with the proposed code conversion apparatus. The clocking pulses passed by the AND gate 15 are applied to the input line 11 of the binary rate multiplier 10 and also as input to the illustrated four decade down counter unit 18. The down counter 18 is of conventional design, capable of being preset by means of control inputs 19 to any desired count condition, and functions to establish the basic timing interval for the conversion process. By way of example, in the illustrated embodiment for converting from binary angular measure to BCD, the counter 18 would be preset to a count condition corresponding to the desired maximum value (C) of the input angular data to be converted; i.e., to a count condition of 3599 corresponding to 359.9° (3599 times a resolution cell of 0.1°) or within one least significant bit (LSB) of the input number.

The counter 18 then operates to count down from this preset count condition, upon receipt of each of the clock pulses passed by the AND gate 15, until the counter 18 reaches its zero count condition at which time the flip-flop 17 is reset to open the AND gate 15 and terminate application of the clocking or timing pulses at input 11 to the rate multiplier 10. In other words, the time interval required for the down counter 18 to count from its preset count condition to zero establishes the interval during which the timing pulses, at $f_{in}$, are applied to the rate multiplier 10. At the end of this interval, the count contained in the up counter 13 is, according to Eq. 2 above, given by the relationship $3599 \times N°/(4096)$ (0.08°) representing the BCD equivalent of the binary value input to the rate multiplier 10 during the conversion period established or set by the down counter 18. As noted earlier, in this embodiment, the value of (C) is preset at 3599 corresponding a maximum angular value of 359.9° and the least significant decade is selected to correspond to tenth of a degree.

As indicated in the drawing, the start of the conversion cycle is initiated by an appropriate signal applied at the set input to the flip-flop 17 from any suitable source (not shown). By way of example, in one application of the present invention, the start conversion signal was in the form of an externally supplied clocking signal which occurred every 3.3 milliseconds. Obviously, however, the particular value chosen for this start signal depends upon the requirements of practice. As shown in the drawing, in addition to setting the flip-flop 17, the start conversion signal would also be utilized to actuate the down counter 18 to its preset count condition and to clear the up counter 13.

Obviously, various modifications, adaptations and alterations are possible in light of the above teachings without in any manner departing from the spirit or scope of the present invention, as defined in the appended claims.

What is claimed is:

1. Apparatus for converting an input signal from one binary form to another format comprising, in combination,
    a binary rate multiplier means connected to receive as a first input said binary signal to be converted and as a second input a series of timing pulses, said binary rate multiplier means producing during application of said timing pulses a series of output pulses whose total count is directly proportional to the value of said input binary signal to be converted,
    a counter means operably connected to register in the desired format the total count of said output pulses from said rate multiplier means,
    a source of timing pulses, and
    control means for operably connecting said timing pulse source to the second input of said binary rate multiplier means for a controlled interval with means for selecting different intervals to correspond with the total desired number of resolution cells into which the maximum possible value of the input signal to be converted is subdivided.

2. The apparatus specified in claim 1 wherein said control means comprises, in combination,
    a second counter means connected to register in the same format as said other counter means a count of the timing pulses applied by said source means to said binary rate multiplier means, and
    circuit means operably interconnected between said source means and said binary rate multiplier means and responsive to the count registered by said second counter means for terminating the interval of application of said timing pulses to said binary rate multiplier means when the count registered by said second counter means reaches a predetermined value.

3. The apparatus specified in claim 2 wherein said circuit means is an AND gate having a first input operably connected to said source means and a second input operably connected to said second counter means.

4. The apparatus specified in claim 3 further including flip-flop circuit means operably interconnected between said second counter means and the second input of said AND gate to produce a gate enabling control signal demarcating the interval during which said second counter means is attaining said predetermined count value.

5. The apparatus specified in claim 2 wherein said second counter means is a down counter adapted to be preset to a count value from which said second counter means counts to zero to time out said interval during which said timing pulses are applied to said binary rate multiplier means.

6. The apparatus specified in claim 2 further including means for actuating said second counter means to its preset count condition and for clearing said other counter means at the start of a conversion process.

7. The apparatus specified in claim 3 further including a flip-flop circuit means operably interconnected between said second counter means and the second input of said AND gate for producing a gate enabling control signal demarcating the interval during which said second counter means is attaining said predetermined count value, said second counter means being a down counter preset to a count value from which said second counter means counts to zero to time out the interval during which said timing pulses are applied to said binary rate multiplier means, said flip-flop means being reset when said second counter means reaches a zero count condition to open said AND gate circuit and terminate the application of timing pulses to said binary rate multiplier means.

8. The apparatus specified in claim 5 wherein said down counter is preset to a count value selected to equal the number of resolution cells into which the maximum value of the number to be converted is subdivided.

* * * * *